(12) United States Patent
Lee et al.

(10) Patent No.: US 6,303,424 B1
(45) Date of Patent: Oct. 16, 2001

(54) METHOD FOR FABRICATING A BURIED BIT LINE IN A DRAM CELL

(75) Inventors: Robin Lee, Hsinchu Hsien; Anchor Chen, Pingtung, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/422,577

(22) Filed: Oct. 21, 1999

(51) Int. Cl.⁷ .............................................. H01L 21/8242
(52) U.S. Cl. ..................... 438/239; 438/253; 438/396; 438/430
(58) Field of Search ................................. 438/239, 253, 438/294, 296, 396, 424, 430

(56) References Cited

U.S. PATENT DOCUMENTS

| | | | |
|---|---|---|---|
| 5,283,453 | * | 2/1994 | Rajeevakumar ................ 257/304 |
| 5,753,551 | * | 5/1998 | Sung ................................ 438/253 |
| 6,048,767 | * | 4/2000 | Terada ............................. 438/262 |
| 6,100,155 | * | 8/2000 | Hu .................................... 438/386 |

FOREIGN PATENT DOCUMENTS 8-125144-A * 5/1996 (JP) .

* cited by examiner

*Primary Examiner*—Carl Whitehead, Jr.
*Assistant Examiner*—Jamie L. Brophy
(74) *Attorney, Agent, or Firm*—Thomas, Kayden, Horstemeyer & Risley

(57) ABSTRACT

A fabrication method for a dynamic random access memory is described, wherein after the formation of the shallow trench in the substrate to define the active region, an isolation structure is formed in the shallow trench. A first conductive layer is formed to cover the substrate and to fill the shallow trench. A portion of the first conductive layer is removed, leaving only the portion in the shallow trench to form a bit line in the shallow trench. Thereafter, an elevated portion is formed on the substrate, connecting the bit line to the active region where the source region is to be formed. A transistor is then formed in the active region. The area of the source region of the transistor includes the substrate under the elevated part, wherein the source region is connected to the second conductive layer. A dielectric layer is further formed covering the substrate, followed by forming a capacitor on the dielectric layer, wherein the capacitor passes through the dielectric layer to connect with the transistor.

10 Claims, 6 Drawing Sheets

US 6,303,424 B1

METHOD FOR FABRICATING A BURIED BIT LINE IN A DRAM CELL

BACKGROUND OF THE INVENTION

1. Field of the Invention

This invention relates in general to a structure and a fabrication method for a dynamic random access memory (DRAM) capacitor. More particularly, the invention relates to a fabrication method for a capacitor over bit-line (COB) DRAM device.

2. Description of the Related Art

In the current information industry, a DRAM device is a very important product. To accompany the advancement and the increased demands on a DRAM device, the DRAM device for an integrated circuit is being designed with increased memory capacity as well as device dimension miniaturization. As a result, a capacitor over bit-line type of DRAM device is being developed.

According to the conventional fabrication method for a COB DRAM device, a transistor is formed in the active region after a shallow trench isolation (STI) structure is formed in the substrate to define the active region of the memory cells. A dielectric layer is further formed to isolate the transistor, followed by forming a bit-line contact in the dielectric layer. A bit line, which is connected to the transistor, is formed on the dielectric layer and in the bit-line contact opening. After another dielectric layer is formed on the bit line, and a node contact is further formed between the two dielectric layers. A capacitor is formed on the second dielectric layer and in the node contact.

According to the above manufacturing process, the steps in forming the bit-line contact, the bit line, the node contact and the capacitor all require the employment of photolithography and etching techniques to define their positions and shapes. Planarization also required after the formation of each of the two dielectric layers to facilitate the subsequent manufacturing process. The conventional approach in forming a COB DRAM device is thus very complicated. Besides, misalignments are likely to occur in each photolithography and etching step. In addition, the formation of the node contact requires the etching of both dielectric layers. The aspect ratio of the node contact is therefore large, which increases the difficulties of the process. As a result, raising the yield for a COB DRAM device becomes very challenging.

SUMMARY OF THE INVENTION

According to the preferred embodiment, the present invention provides a fabrication method for a DRAM device, in which a semiconductor substrate is provided and a pad oxide layer and a nitride layer of a specific pattern are formed on the substrate using the nitride layer as a mask. Etching is conducted on the substrate to form a shallow trench in the substrate and to define an active region. A liner oxide layer is then formed to cover the inner wall of the shallow trench, followed by forming a barrier layer to cover the substrate, including the inner wall of the trench. Thereafter, a first conductive layer is formed to cover the substrate and to fill the shallow trench. A portion of the first conductive layer is then removed, leaving only the first conductive layer in the shallow trench to become a bit line. An insulation layer is then formed to cover the substrate, followed by chemical mechanical polishing the insulation layer until the nitride layer is exposed. A partial etch back is conducted to remove a portion of the conductive layer and the nitride layer. A portion of the pad oxide layer at the peripheral of a side of the shallow trench is further removed to form a bit-line contact, revealing a part of the bit line and extending into the active region.

An elevated feature is formed in the bit-line contact, which is connected to the bit line and covers the area in the active region where the source region is to be formed. The elevated feature includes a second conductive layer, a cap layer, a barrier layer and a spacer. A transistor, including a gate oxide layer, a gate serving as a word line of the memory cells, a gate cap layer, a gate spacer, a source region and a drain region, is formed in the active region. The source region of the transistor extends to the bottom of the elevated feature and is connected to the second conductive layer of the elevated feature. A dielectric layer is then formed to cover the substrate. A node contact is formed in the dielectric layer to expose the drain region of the transistor. A capacitor, connected to the drain region of the transistor, is then formed in the node contact and on the dielectric layer.

According to the above approach, since the bit line is formed in the shallow trench, the space in the integrated circuit is being efficiently used. In addition, only one layer of the dielectric layer is formed, which greatly simplifies the manufacturing process and reduces the number of planarization steps. Furthermore, the dielectric layer, which needs to be etched during the formation of the node contact, is thinner. The aspect ratio of the node contact is thereby lowered, which in turns facilitates the etching process for the formation of the node contact as well as the fabrication of the capacitor.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

Figure 1:
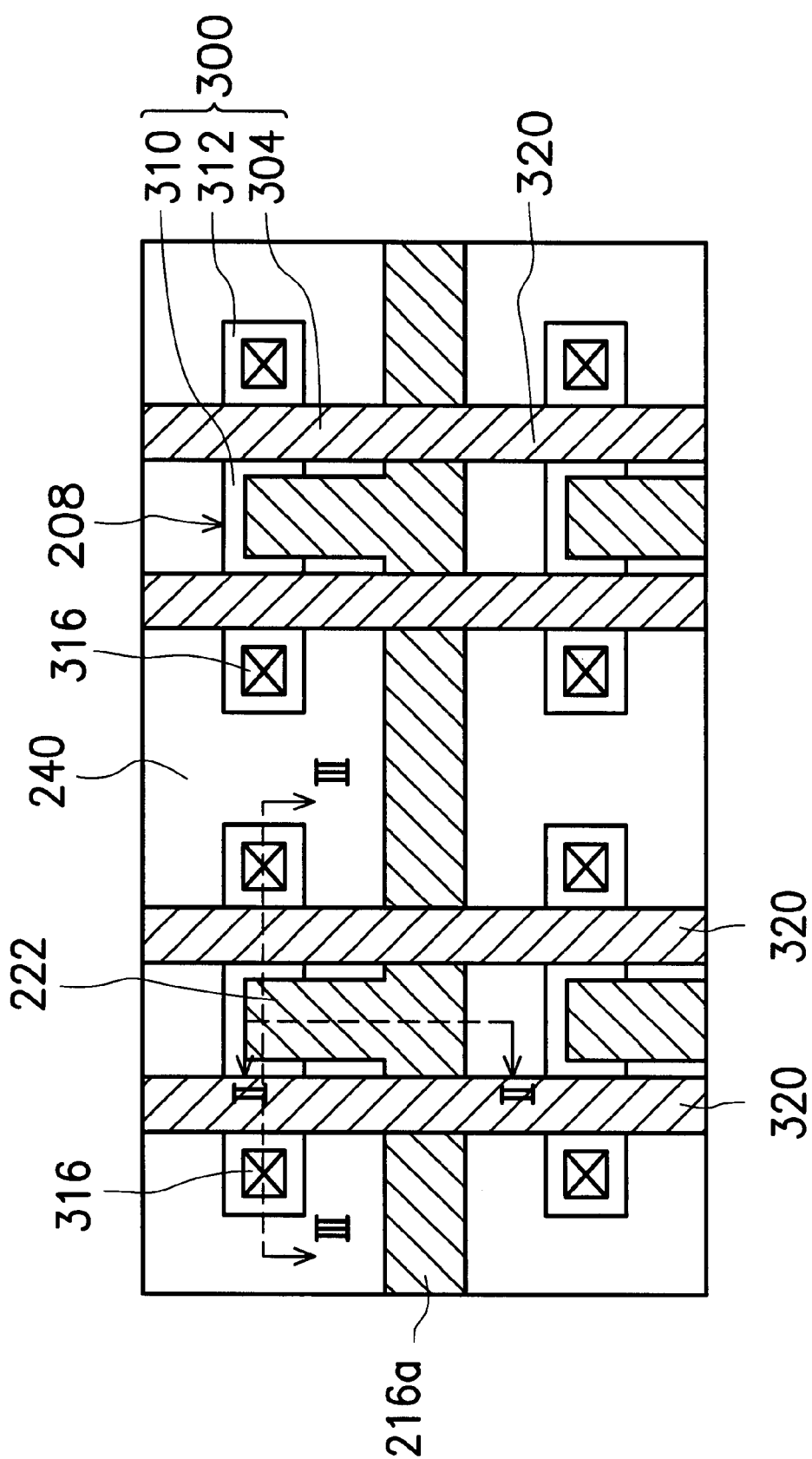
FIG. 1 is a schematic, top view showing a part of a dynamic random access memory device formed according to the preferred embodiment of the present invention.

In order to clarify the embodiment of the present invention, FIG. 1 presents the top view of a part of a DRAM device formed according to the preferred embodiment of the present invention. As shown in FIG. 1, an active region 208, shallow trenches isolation structure 240, a bit line 216a and a word line 320 are formed on a substrate 200. A source region 310 and a drain region 312 are also formed in the active region 208. The part of the word line 320 inside the active region 208 is used as a gate 304. The gate 304, the source region 310, the drain region 312 and the gate oxide layer (not shown in Figure) underlying the gate 304 together form a transistor 300. The word line 320 is formed on the substrate surface, whereas the bit line 216a is formed under the substrate surface and is connected to the source region 310 of the transistor 300 in the active region 208 via an elevated feature 222.

FIGS. 2A to 2E are schematic, cross-sectional views showing the fabrication of a part of a dynamic random access memory device located along the dotted lines II as depicted in FIG. 1.

FIGS. 3A to 3F are schematic, cross-sectional views showing the fabrication of a part of a dynamic random access memory device located along the dotted lines III as depicted in FIG. 1.

Figure 2A:
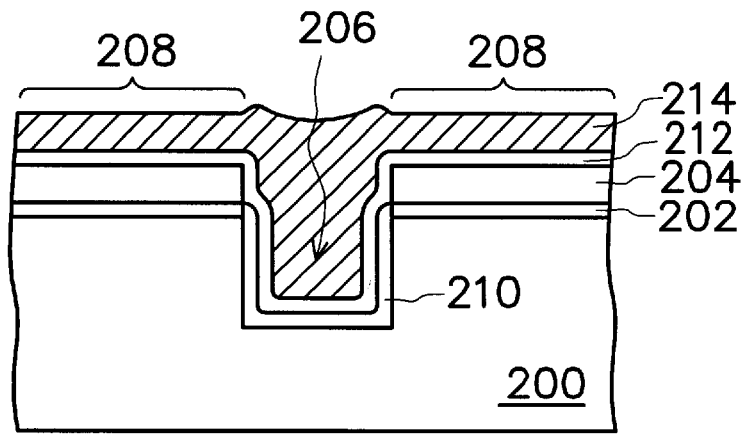
FIGS. 2A to 2F are schematic, cross-sectional views showing the fabrication of a part of a dynamic random access memory device located along the dotted line II—II as depicted in FIG. 1.
Figure 3A:
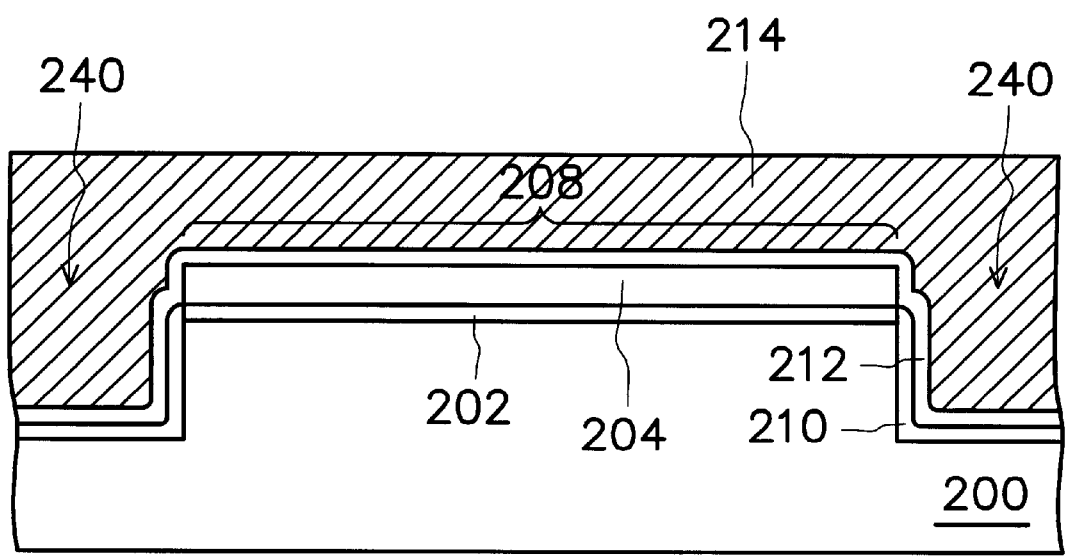
FIGS. 3A to 3F are schematic, cross-sectional views showing the fabrication of a part of a dynamic random access memory device located along the dotted line III—III as depicted in FIG. 1.

As shown in FIG. 2A, using the patterned pad oxide layer 202 and the nitride layer 204 formed on the substrate 200 as masks, a portion of the substrate 200 is removed and a shallow trench 206 is formed in the substrate 200. In the same process, shallow trenches 240 are also formed, as illustrated in FIG. 3A. The pad oxide layer 202 and the nitride layer 204 are formed by, for example, sequentially forming the pad oxide layer 202 and the nitride layer 204, for example, by means of chemical vapor deposition to cover the substrate 200. The portion of the pad oxide layer 202 and the nitride layer 204 located in the area to become shallow trenches 206 and 240 is removed by means of photolithography and etching. A liner oxide layer 210 is then formed covering the inner walls of the shallow trenches 206 and 240. A barrier layer 212, for example an oxide/nitride/oxide structure, is further formed to cover the substrate 200. Thereafter, a first conductive layer 214 is formed, covering the substrate 200 and filling the shallow trenches 206 (FIG. 2A) and 240 (FIG. 3A).

Figure 2B:
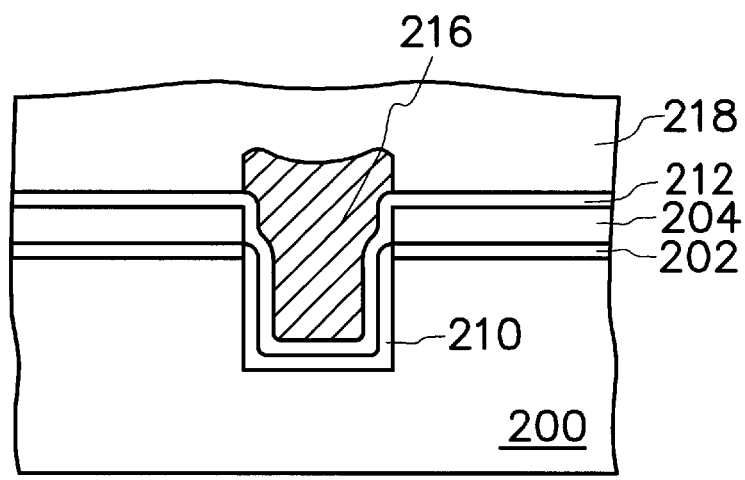
Figure 3B:
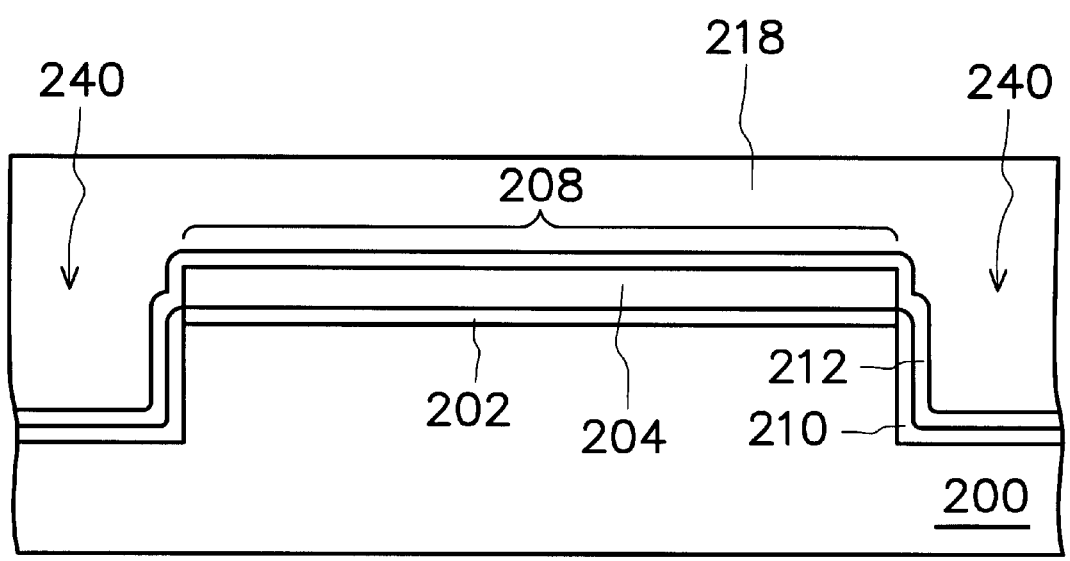

Referring to FIG. 2B, a portion of the first conductive layer 214 is removed, for example, by an etch back, leaving only the portion in the shallow trench 206 to form a bit line 216 in the shallow trench 206. The first conductive layer 214 is removed by, for example, chemical mechanical polishing. Correspondingly, the first conductive layer 214 in the shallow trenches 240, in FIG. 3B, is also removed. Thereafter, an insulation layer 218 is deposited on the substrate 200 as indicated in FIGS. 2B and 3B, filling the shallow trenches 240 (FIG. 3B). The insulation layer 218, such as silicon oxide, is formed by, for example, chemical vapor deposition.

Figure 2C:
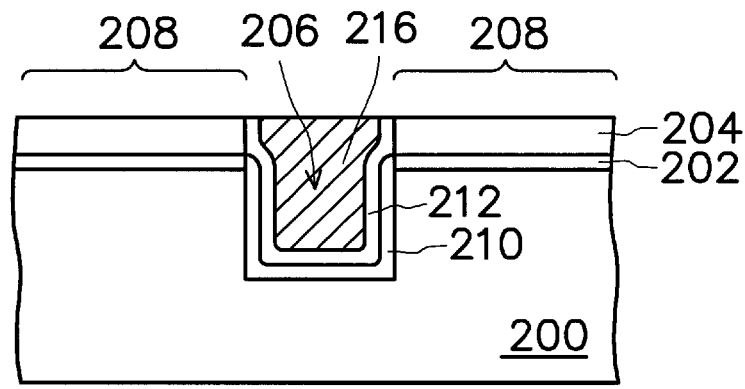
Figure 3C:
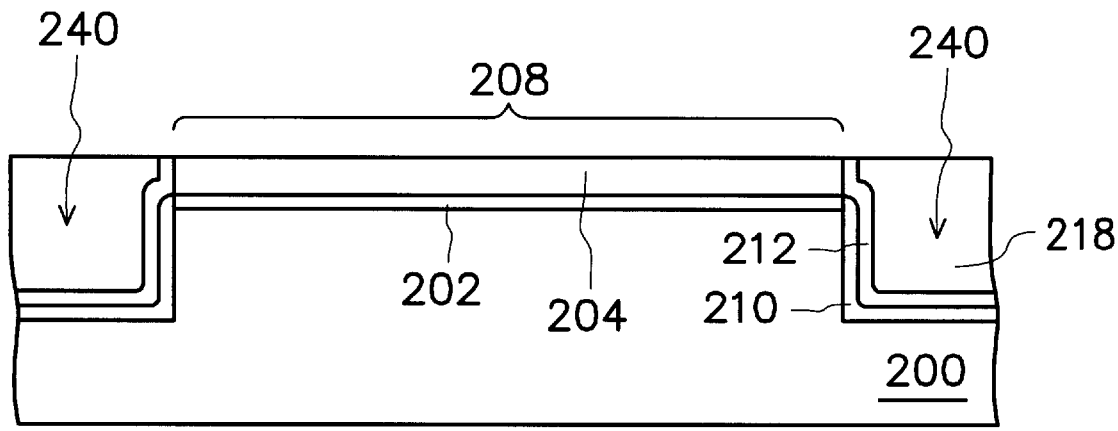

Referring to FIGS. 2C and 3C, the insulation layer 218 and the portion of the bit line 216 and the barrier layer 212 that is above the silicon nitride layer 204 are removed (as shown in FIG. 2C) by, for example, chemical mechanical polishing, using the silicon nitride layer 204 as an etch stop. In trench 206, the bit line 216 is formed as illustrated in FIG. 2C; correspondingly, in trench 240, the insulation layer 218 is formed as shown in FIG. 3C.

Figure 2D:
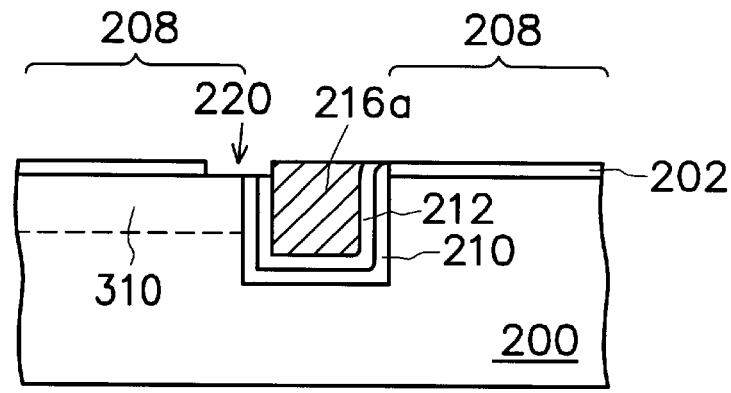

Thereafter, as shown in FIG. 2D, an etch back is then conducted to remove a portion of the bit line 216 (as in FIG. 2C) to form the bit line 216a. As further illustrated in FIGS. 2D and 3D, the nitride layer 204 is removed. In addition, a portion of the pad oxide layer 202, which is at the periphery of a part of the shallow trench 206 and above a portion of the source region 310 to be formed subsequently (as indicated by the dotted line in FIG. 2D), is also removed, for example, by photolithography and wet etching, to form a bit line contact 220. The bit line contact 220 reveals an upper edge of the bit line 216a, as shown in FIG. 2D, and extends into the active region 208 as shown in FIG. 3D.

Figure 2E:
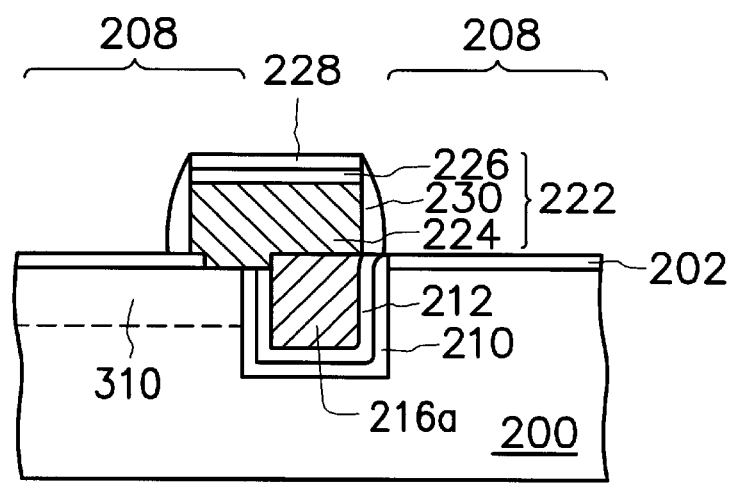
Figure 2F:
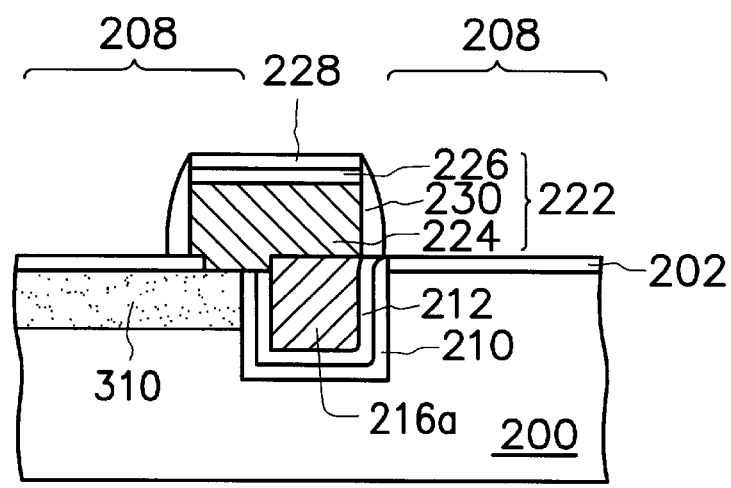
Figure 3D:
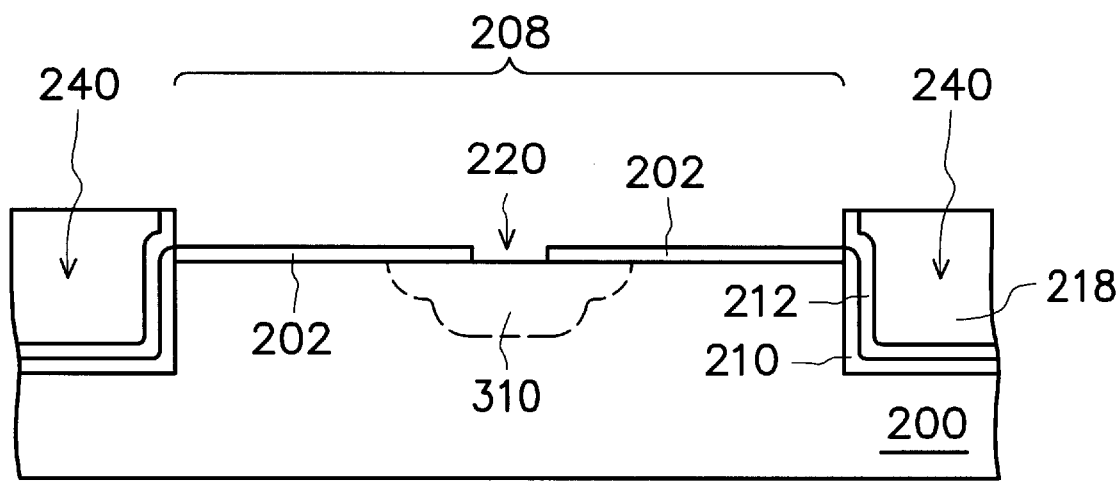
Figure 3E:
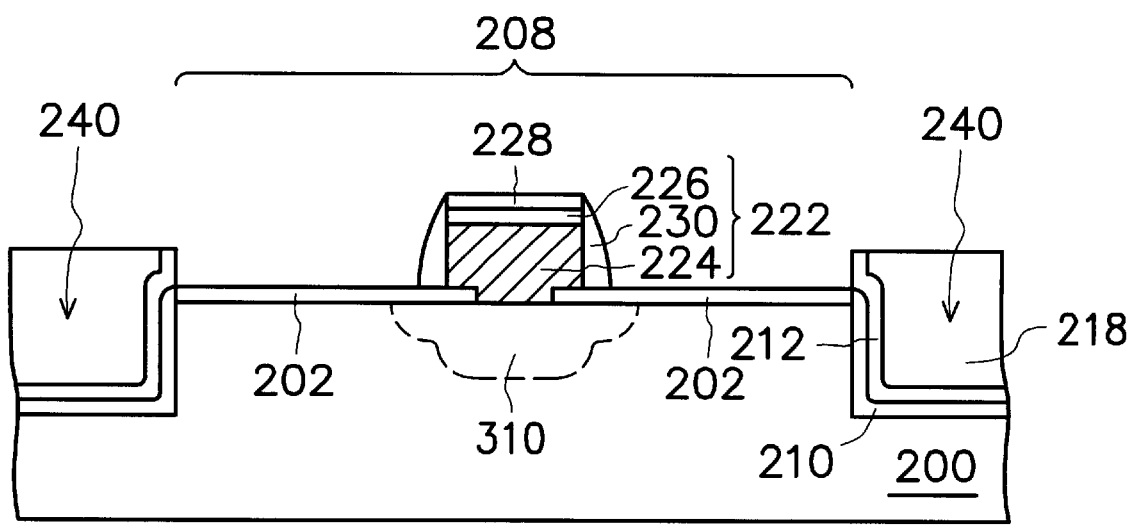

Referring to FIGS. 2E and 3E, an elevated feature 222 is formed in the bit-line contact 220 (as indicated in FIGS. 2D and 3D), extending to the active region 208 and directly connecting to the bit line 216a where the source region 310 (as depicted by the dotted line in FIG. 2E) is to be formed.

The elevated feature 222 is formed by, for example, depositing a conductive layer 224 to cover the substrate 200 and to fill the bit-line contact 220. A cap layer 226 and a barrier layer 228 are then formed on the second conductive layer 224, followed by removing a portion of the conductive layer 224, the cap layer 226 and the barrier layer 228 by means of photolithography and etching. Spacers 230 are also formed adjacent to the sidewalls of the conductive layer 224, the cap layer 226 and the barrier layer 228. The conductive layer 224 includes, for example, polysilicon. The cap layer 226 and the spacer 230 are, for example, an oxide material formed by chemical vapor deposition. The barrier layer 228 includes, for example, a nitride material formed by chemical vapor deposition.

Figure 3F:
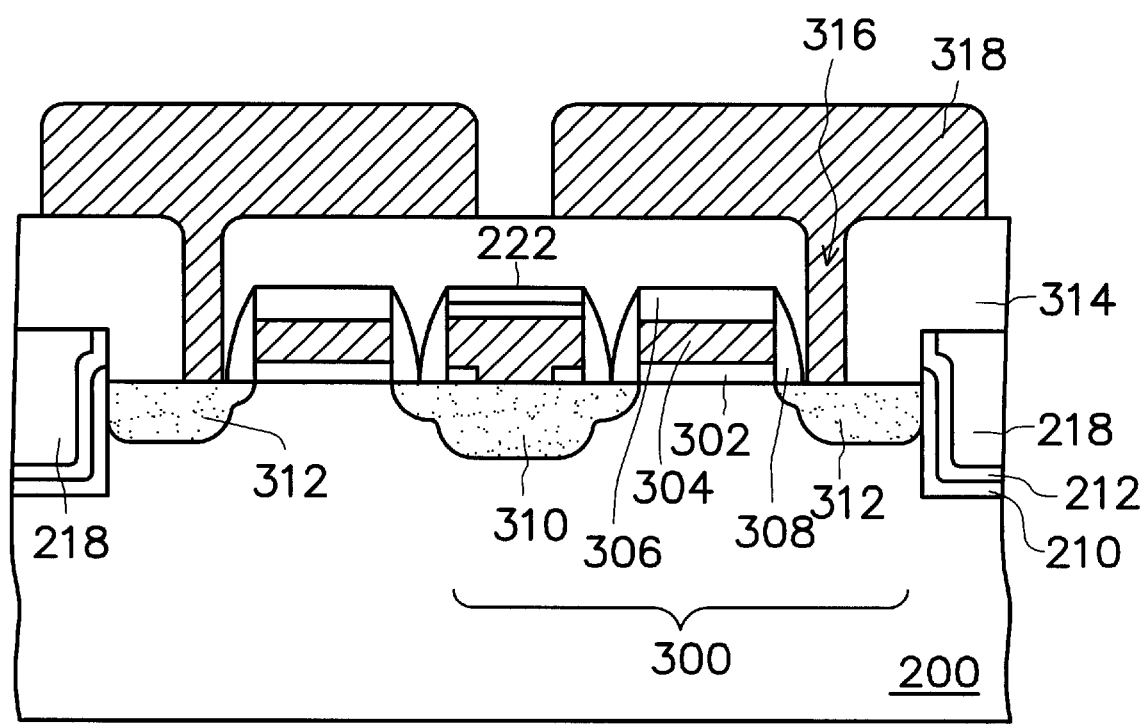

Continuing to FIG. 3F, a transistor 300 is formed in the active region 208. The transistor 300 includes a gate oxide layer 302, a gate 304, a gate cap layer 306, gate spacers 308, a source region 310 and a drain region 312. The source region 310 is extended to the substrate 200 underneath the elevated feature 222, and the source region 310 is in contact with the conductive layer 224 of the elevated feature 222 (as indicates in FIGS. 2E and 3E). Thereafter, a dielectric layer 314 is formed, covering the substrate 200, and a node contact 316 is formed in the dielectric layer 314, exposing the drain region 312. The dielectric layer 314 is formed by, for example, chemical vapor deposition, and the node contact 316 is formed by methods including photolithography and etching. A capacitor 318 is then formed on the dielectric layer 314 and in the node contact 316 and is directly connected to the drain region 312.

According to the preferred embodiment of the present invention, the bit line is formed in the shallow trench, and the space in the integrated circuit is thus being efficiently used. In addition, only one layer of the dielectric layer is formed, which greatly simplifies the manufacturing process and reduces the number of planarization steps. Furthermore, the dielectric layer, which needs to be etched during the formation of the node contact, is thinner. The aspect ratio of the node contact is thereby lowered, which in turns facilitates the etching process for the formation of the node contact as well as the fabrication of the capacitor.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A fabrication method for a dynamic random access memory device, the method comprising the steps of:

forming a pad oxide layer and a nitride layer on a substrate;

forming a plurality of shallow trenches in the substrate and defining an active region;

forming a liner oxide layer to cover inner walls of the shallow trenches;

forming a first barrier layer to cover the substrate;

forming a bit line in some of the shallow trenches;

filling some of the shallow trenches with an insulation layer where the bit line is not formed to form shallow trench isolation structures;

removing the nitride layer;

removing a portion of the pad oxide layer at a periphery of the shallow trenches to form a bit-line contact, wherein the bit-line contact extends into the active region and reveals a portion of the bit line;

forming an elevated feature in the bit-line contact, in which the elevated feature is connected to the bit line and covers a part of the active region where a source region is to be formed; and forming a transistor in the active region, wherein the transistor comprises the source region and a drain region, and the source region is extended to a bottom of the elevated feature and is connected to the elevated feature.

2. The fabrication method for a dynamic random access memory device according to claim 1, wherein the method further includes conducting the following steps after the formation of the transistor:

forming a dielectric layer to cover the substrate;

forming a node contact in the dielectric layer to expose the drain region of the transistor; and forming a capacitor in the node contact and on the dielectric layer wherein the capacitor is connected to the drain region.

3. The fabrication method for a dynamic random access memory device according to claim 1, wherein the formation of the bit line includes:

forming a first conductive layer to cover the substrate and to fill the shallow trenches; and removing a first portion of the first conductive layer and leaving a second portion of the first conductive layer in the shallow trenches.

4. The fabrication method for a dynamic random access memory device according to claim 3, wherein the first portion of the first conductive layer is removed by means of chemical mechanical polishing.

5. The fabrication method for a dynamic random access memory device according to claim 1, wherein the formation of the elevated feature includes:

forming a second conductive layer to cover the substrate and to fill the bit-line contact;

forming sequentially a cap layer and a second barrier layer on the second conductive layer;

patterning the second conductive layer, the cap layer and the barrier layer; and forming a plurality of spacers adjacent to sidewalls of the second conductive layer, the cap layer and the barrier layer.

6. The fabrication method for a dynamic random access memory device according to claim 1, wherein the first barrier layer includes an oxide material/nitride material/oxide material structure.

7. A fabrication method for a dynamic random access memory device comprising a bit line, wherein the fabrication method for the bit line including the steps of:

forming a shallow trench in the substrate and defining an active region thereon;

forming liner oxide layer and a first barrier layer on the shallow trench;

forming a bit line in the shallow trench; and forming an elevated feature which is connected to the bit line and to a portion of the substrate in the active region.

8. The fabrication method for a dynamic random access memory device according to claim 7, wherein the formation of the bit line includes the following steps:

forming a first conductive layer to cover the substrate and to fill the shallow trench; and removing a first portion of the first conductive layer and leaving a second portion of the first conductive layer in the shallow trench.

9. The fabrication method for a dynamic random access memory device according to claim 7, wherein forming the elevated feature includes:

forming a second conductive layer to cover the substrate;

forming a cap layer and a second barrier on the second conductive layer;

patterning the second conductive layer, the cap and the barrier layer; and forming a spacer on sidewalls of the second conductive layer, the cap layer and the second barrier layer, wherein the second conductive layer of the elevated feature is connected to the bit line and to a portion of the substrate in the active region.

10. The fabrication method for a dynamic random access memory device according to claim 7, wherein the first barrier layer includes an oxide material/nitride material/oxide material structure.

* * * * *